United States Patent
Yamada et al.

(10) Patent No.: US 6,949,215 B2
(45) Date of Patent: Sep. 27, 2005

(54) METHOD FOR PROCESSING A THREE-DIMENSIONAL STRUCTURE BY LASER

(75) Inventors: Yasufumi Yamada, Tokyo (JP); Katsumi Midorikawa, Saitama (JP); Hiroshi Kumagai, Saitama (JP)

(73) Assignees: Ricoh Company, Ltd., Tokyo (JP); Riken, Saitama (JP)

( * ) Notice: Subject to any disclaimer, the term of this patent is extended or adjusted under 35 U.S.C. 154(b) by 138 days.

(21) Appl. No.: 10/369,723

(22) Filed: Feb. 21, 2003

(65) Prior Publication Data

US 2003/0213770 A1 Nov. 20, 2003

(30) Foreign Application Priority Data

Feb. 21, 2002 (JP) ........................................ 2002-044640

(51) Int. Cl.$^7$ ............................. B23K 26/00; H01S 3/00
(52) U.S. Cl. ............. 264/400; 219/121.69; 219/121.72; 219/121.85; 264/139; 264/482
(58) Field of Search ................................ 264/139, 400, 264/482; 219/121.69, 121.72, 121.85

(56) References Cited

U.S. PATENT DOCUMENTS 5,656,229 A * 8/1997 Tanimoto et al. ........... 264/400

FOREIGN PATENT DOCUMENTS

JP 56160893 A * 12/1981 ............ 219/121.85

OTHER PUBLICATIONS

K. Midorikawa, O plus E, vol. 21, No. 9, pp. 1130–1136, "Femtosecond Laser Material Processing", Sep. 1999 (with English translation).
H. Kumagai, Applied Physics, vol. 67, No. 9, pp. 1051–1055, "Femtosecond Laser Material Processing", Sep. 1998 (with partial English translation).
B. N. Chichkov, et al., Applied Physics A, vol. 63, pp. 109–115, "Femtosecond, Picosecond and Nanosecond Laser Ablation of Solids", 1996.

* cited by examiner

*Primary Examiner*—Leo B. Tentoni
(74) *Attorney, Agent, or Firm*—Oblon, Spivak, McClelland, Maier & Neustadt, P.C.

(57) ABSTRACT

A laser processing method capable of performing fine and highly accurate processing by low energy is obtained.

The invention relates to the laser processing method where laser beam for processing (4) is irradiated on a processing object (2) and the laser beam for processing (4) directly removes a part of the processing object (2). The processing object (2) is made of a glass substrate, metal thin film (3) having high absorption to laser beam for processing (4) is formed on a surface of glass substrate, into which laser beam for processing (4) is made incident, the laser beam for processing (4) is irradiated from a surface of metal thin film (3), and matter is directly removed by irradiation of laser beam onto the processing object (2) in order to form a region finer than an irradiation region of laser beam for processing (4) on the processing object (2).

13 Claims, 7 Drawing Sheets

METHOD FOR PROCESSING A THREE-DIMENSIONAL STRUCTURE BY LASER

BACKGROUND OF THE INVENTION

1. Field of the Invention

The present invention relates to a method for processing by laser, in which laser beam is irradiated on a processing object to directly form a fine shape on the processing object, an apparatus for processing by laser and a three-dimensional structure on which a fine shape is formed by the apparatus.

2. Description of the Prior Art

Conventionally, etching technology for using photolithography has been mainly used as a processing method that forms a highly accurate three-dimensional shape of a fine part as the processing object. In this processing method, resist material is coated on a substrate of processing object, light is selectively irradiated on the resist material, solution processing is performed, and a desired pattern is thus formed. In the method, etching is subsequently performed to remove a resist region other than a light irradiation region, and thus forming the three-dimensional shape.

In this processing method, two regions, which are a processing region, and a processed region are formed on the substrate by a series of operation from resist coating to exposure, fixing, development, development, etching of the processing object and resist removal.

However, the conventional etching processing method by photolithography has a complicated process and requires a large number of processing. Further, it also requires complicated process such as resist processing, exposure, development, baking or the like. In exposure process, a resist pattern changes due to exposure, so that it is necessary that exposure intensity (time) be controlled strictly and uniformly.

Furthermore, in forming a pattern on the processing object, a strict alignment operation is required, and its adjustment operation is required. In the case where the pattern formed on the processing object is a concave portion, a pore or the like, and its depth needs to be changed depending on a processing area, accurate alignment of exposure equipment to the substrate, to which processing has been performed once, must be performed again, and a large number of process need to be repeated.

Further, exposure conditions may change regarding exposure onto the substrate, to which processing has been made once, comparing to exposure onto an unprocessed flat substrate. Moreover, in the processing by photolithography, a method to form the resist pattern by light is mainly used. In this case, it is difficult to define a material-removing region smaller than an irradiation region of light on the processing object.

In addition, in a conventional microfabrication processing by laser, carbon dioxide gas laser ($CO_2$ laser), ultraviolet laser represented by excimer laser, short pulse laser, or second and third harmonics of three-dimensional-state laser such as Nd:YAG, Nd:YLF and Nd:YVO$_4$ has been used.

The excimer laser has a wavelength from 157 nm to 309 nm and a pulse width from a few nanoseconds to a few tens nanoseconds as central values. The excimer laser is used particularly for polymer having high absorption to light within the wavelength range. Since the processing method by the excimer laser can remove matter on a laser irradiation area (laser irradiation region) by laser of extremely short pulse comparing to its thermal diffusion length, it is known as a method having high accuracy of the processing region and little thermal damage.

Furthermore, a processing method using femtosecond laser is known in recent years as a microfabrication processing method for metal or the like. This is a processing method using laser beam having the pulse width from a few tens femtoseconds to a few hundred femtoseconds as the central value. There exists Ti: Sapphire laser as a typical light source used in this processing method. These are known to be capable of performing fine and highly accurate processing to various kinds of material such as metal and ceramic. The processing method by the laser is described in the thesis shown below.

Appl. Phys. A 63, pp109–115 (1996)

Applied Physics 67(9), p1051 (1998)

O Plus E 21(9), p1130 (1999)

Since the processing of transparent material by the laser basically uses multi-photon absorption of material, it is said to be capable of processing an object having a size of the wavelength or less. However, laser processing condition is required that the intensity of light be relatively large in processing the transparent material.

Further, there is known a metal removal method for correction by photomask in processing thin film layer by conventional laser. This is a method where laser beam is irradiated from above a metal thin film deposited on a glass substrate, and the metal film is selectively removed by fusing and vaporizing it.

However, processing by $CO_2$ laser or YAG laser is basically thermal processing. For this reason, when a micro region is processed and formed on the processing object by using the laser, the vicinity of an irradiation region of laser beam easily causes thermal deformation and fusion in low melting point material such as polymer, so that highly accurate processing is difficult.

Further, in brittle material such as glass and ceramic, there are cases where fracture or crack occurs in the irradiation region of laser beam, it has been difficult to form a fine shape on the processing object.

Furthermore, in the processing by harmonic of excimer laser or YAG laser, a processing range is generally defined only to material having high absorption to its laser wavelength, and thus the processing of the transparent material has been difficult, or it has been necessary that the material be processed by vacuum ultraviolet beam that cannot be used in the atmosphere. Even in such a case, the processing has often required extremely high irradiation intensity of laser beam.

Moreover, it has been difficult to form a region smaller than the irradiation region of laser beam on the processing object even if the laser beam for processing is used, and thermal diffusion or the like sometimes has caused a processing region to have a larger width than the irradiation region of laser beam.

In the case of ablation processing by Ti: Sapphire laser having the pulse width from a sub-pico second to a pico second, it is known to be capable of performing highly accurate processing even to the metal material. However, the transparent material has a long light permeability length and removal of micro amount of matter of the processing object has been difficult, and there have been cases where crack or the like occurred.

In recent years, micropore processing by the multi-photon absorption of laser in the sub-pico second region has been implemented. In this processing method, laser beam is focused into high intensity to efficiently perform light absorption of a transparent body as the processing object. This makes it possible to process and form the micro region on the processing object by resolving power of the wavelength or less. However, in this case, there has existed a problem that extremely large energy density was required and a laser light source with high energy in an extremely short pulse width was required.

Further, although it is possible to remove the matter of thin film layer formed on an upper surface of the processing object by a thin film processing method using a conventional laser ablation method, no consideration is paid to removing the matter on a surface of the processing object, which exists under the thin film layer, and forming a fine shape on a surface of processing object.

Still further, a method of simultaneously removing the matter of the thin film layer and on the surface (contact surface or boundary surface) of the processing object by using the thin film layer, and a processing method of reforming adjacent material by utilizing absorption of the thin film have been suggested. However, technology regarding fine structure processing of the laser irradiation region or smaller has not been known.

SUMMARY OF THE INVENTION

The object of the present invention is to solve the problems in the conventional laser processing methods, and to provide a processing method using laser capable of performing fine and highly accurate processing to the processing object with low energy, a processing apparatus using laser, and a three-dimensional structure on which a highly accurate and fine shape has been formed.

The inventors, as a result of intensive study, have newly found out a method to solve the problems in the conventional laser processing and to realize microfabrication. The method is a method that uses the relationship between a laser absorption layer and laser irradiation intensity distribution. Microfabrication to the laser irradiation region or smaller is enabled by this method. Further, according to this method, fine and micro amount processing to material, which is considered to be refractory material in the conventional laser processing method, can be realized without occurrence of flash, warp or the like.

The processing method using laser of the present invention is a method where laser beam for processing is irradiated onto the processing object and the laser beam for processing directly removes a part of matter of the processing object, in which an absorptive thin film material layer having high absorption to the laser beam for processing is formed on a surface of processing object, into which the laser beam for processing is made incident, the laser beam for processing is irradiated from a surface of absorptive thin film material layer, and thus removing the matter in a region finer than the laser irradiation region on the processing object.

According to the invention, it is possible to perform processing with lower energy comparing to the case where the absorptive thin film material layer is not used, processing can be performed with a processing width smaller than the irradiation region, and thus a fine shape can be formed.

The processing object may be made of material of high permeability to the laser beam for processing.

With this, since the absorptive thin film material layer is formed on the material of high permeability, it is possible to perform fine and highly accurate processing to the processing object made of material of high permeability.

Further, the processing object may be made of brittle material.

With this, high quality processing can be performed to the processing object made of the brittle material while preventing flash, crack or the like from occurring.

It is desirable that the absorptive thin film material layer be metal thin film.

With this, the processing object and the absorptive thin film material layer can be efficiently removed.

It is desirable that intensity distribution of the laser beam for processing, which corresponds to its removing region, be shaped corresponding to a processing object shape, and then the region finer than the laser irradiation region be processed.

With this method, the laser beam for processing is irradiated after shaping, so that it is possible to process the processing object in an arbitrary shape.

When the laser beam for processing is focused to form the micropore, processing of a finer shape can be performed.

When the laser beam for processing is shaped into a linear shape, a fine linear shape can be formed.

When the laser beam for processing is irradiated while the position of processing object is controlled with respect thereto, a large number of pores can be continuously formed.

When laser is used where laser beam for processing has the pulse width of 10 picoseconds or less, a thermal diffusion region can be restricted even for material such as metal having high-speed thermal conductivity due to the short pulse width.

Therefore, it is possible to remove the material having high-speed thermal conductivity by low energy and to perform processing efficiently.

Laser beam intensity and an irradiation position are scanned synchronizing with laser oscillation of the laser beam for processing, and matter removal in the micro region of processing object may be continuously performed.

With this method, it is possible to form shapes continuously in a wide area.

A second characteristic of the laser processing method of the present invention is that the absorptive thin film material layer that absorbs light is formed on the surface of processing object, and the micro region smaller than the irradiation region of laser beam is directly processed and formed on the surface of processing object via the absorptive thin film material layer by using the relationship between the absorptive thin film material layer and the intensity distribution of irradiation region of the laser beam for processing onto the processing object.

It is desirable that the beam shape of laser beam for processing be shaped and irradiated onto the absorptive thin film layer, which has been formed on the surface of processing object, and the micro region be processed and formed.

It is further desirable that the processing object be made of the transparent material or the brittle material.

Operational effects by these processing methods will be made clear by detailed description.

The laser processing apparatus of the present invention is characterized by comprising: laser beam for processing generation means that irradiates the laser beam for processing onto the absorptive thin film material layer having high absorption to the laser beam for processing, which is formed on the surface of processing object into which the laser beam for processing is made incident, and that directly removes a part of matter of the processing object by the laser beam for processing; intensity adjustment means that adjusts intensity of the laser beam for processing output from the laser beam for processing generation means; laser beam shaping means that shapes the laser beam for processing, and laser irradiation positional control means that controls an irradiation position of the laser beam for processing for the processing object.

According to the present invention, processing by lower energy is made possible comparing to the case where the absorptive thin film material layer is not used, processing can be performed in the processing width smaller than the irradiation region, the fine shape can be formed and the fine shapes can be continuously formed, and processing of the wide area can be further performed.

The three-dimensional structure of the present invention comprises a micro material-removing region of the absorptive thin film material layer, which has been formed by irradiating the laser beam for processing onto the absorptive thin film material layer having high absorption to the laser beam for processing, which has been formed on the surface of the processing object into which the laser beam for processing is made incident, and a material-removing region of the processing object, which exists in the material-removing region and is finer than the material-removing region.

With this, it is possible to obtain the three-dimensional structure on which fine shapes are processed.

In the three-dimensional structure, the absorptive thin film material layer may be removed from the processing object after the material-removing region has been formed. With this, the processing object is made of a transparent body so that it can be used as a transmissive optical device, a processing shape is less restricted, and it can be applied for wider design values.

The absorptive thin film material may be metal thin film. With this, it is possible to obtain a reflective optical device such as a reflective diffraction grating.

Further, the metal film may be formed on the processing object after the absorptive thin film material layer has been removed.

Furthermore, the three-dimensional structure may comprise a micro material-removing region of a platinum layer, which has been formed by irradiating the laser beam for processing onto the platinum layer having high absorption to the laser beam for processing, which has been formed on the surface of the processing object into which the laser beam for processing is made incident, a material-removing region having the same width as the material-removing region, and a material-removing region of the processing object, which exists in this material-removing region and is finer than the material-removing region. With this, it is possible to form the three-dimensional structure having two-step micro material-removing region.

Further, the platinum layer may be removed after the material-removing region has been formed.

BRIEF DESCRIPTION OF THE DRAWINGS

FIG. 5A is cut along B—B line.

DETAILED DESCRIPTION OF THE EMBODIMENTS

Preferred embodiments of the present invention will be described with reference to the drawings.

[First Embodiment]

Figure 1A:
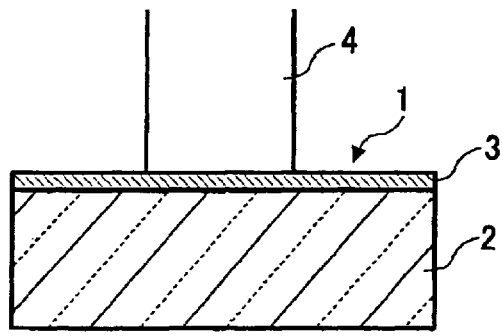
FIG. 1A is an exemplary view of a processing method of a three-dimensional structure according to a first embodiment of the present invention, and is a sectional view showing the state where laser beam for processing is irradiated onto a processing object.
Figure 1B:
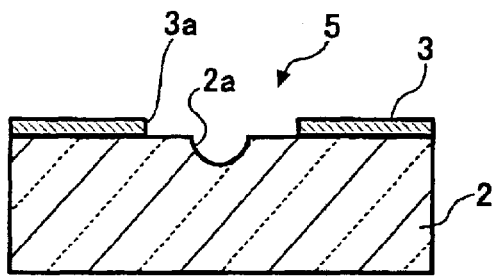
FIG. 1B is an exemplary view of the processing method of the three-dimensional structure according to the first embodiment of the present invention, and is a sectional view showing the three-dimensional structure on which a fine shape has been processed and formed by irradiation of the laser beam for processing on the processing object.
Figure 2:
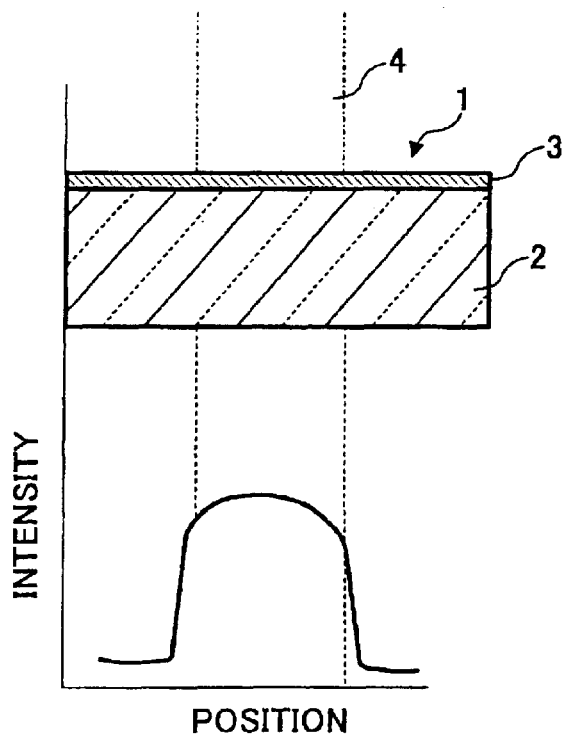
FIG. 2 is a view showing the relationship between a pore position and a pore width of the fine shape processed and formed on the processing object and intensity distribution of corresponding laser beam for processing.

FIGS. 1A and 1B illustrate an exemplary view of a method for processing a three-dimensional structure according to a first embodiment of the present invention, FIG. 2 is the view showing the relationship between position of pore and width of pore in a fine shape processed and formed on a processing object and the intensity distribution of corresponding laser beam for processing.

In the laser processing method of the first embodiment, a thin film 3 of metal as an absorptive thin film material layer is formed on a surface of a flat glass substrate 2 as the processing object first, as shown in FIG. 1A. Thus, a processing object (processing target) 1 is formed. The metal thin film 3 having high absorption to the laser beam for processing is used. At this point, it is desirable that a film thickness of metal thin film 3 be the order of a length for absorption of laser beam (length for permeability of light).

Next, laser beam for processing 4 is irradiated onto the surface of metal thin film 3 spatially and selectively with certain intensity distribution. Herein, "certain intensity distribution" means intensity distribution of beam whose irradiation shape is shaped such that the intensity becomes maximum on the micro region of processing object on which the fine shape is intended to form.

Then, one pulse of the laser beam for processing 4 is irradiated onto the metal thin film 3. Thus, removal of material in the micro region on the metal thin film 3 is performed. Then, the fine shape smaller than the irradiation width of laser beam is generated near the maximum region of light intensity distribution on the glass substrate 2 by energy applied to the metal thin film 3. By adjusting laser beam intensity of the laser beam for processing 4, it is possible to control a removed width and a removed depth of the processing object 1.

Cu, Ni, Al or the like, for example, can be used for the metal thin film 3. Further, metal oxide film, ceramic thin film or the like other than the metal thin film 3 can be used as the absorptive thin film material layer.

In the laser processing method of this embodiment, light absorption by the metal thin film 3 as the absorptive thin film material layer is used, so that the laser beam for processing 4 can be efficiently absorbed. Accordingly, processing by lower energy is made possible comparing to the case where the absorptive thin film material layer is not used.

Herein, by adjusting the intensity of laser beam of the laser beam for processing 4, processing is realized only in a region where the intensity distribution of laser beam is strong. Thus, formation of the micro region smaller than the irradiation region of laser beam is made possible by processing.

Further, since processing is performed by propagation of energy of the absorptive thin film material layer, highly accurate processing without flash, chip, crack or the like, which occurs in the case of a regular laser processing method, can be realized.

Furthermore, transparent material such as glass and quartz is used as material that constitutes the flat substrate 2. At this point, it is possible to use the laser beam for processing 4 having a wavelength region of low absorption to the transparent material. In addition, by selecting the absorptive thin film material layer, the laser beam for processing of a wide wavelength region can be selected.

Processing to the transparent material is extremely difficult by a regular laser thermal processing. This is because its light permeability length is long and thus processing to a region shallower than the light permeability length has been difficult. However, with the use of the processing method of the first embodiment of the present invention, it becomes possible to process with good accuracy the formation of micro amount of region on the transparent material.

Particularly, according to the processing method of the first embodiment of the present invention, formation of the micro region by matter removal at a depth of a nanometer order can be performed to the transparent material as well. This is a region of a significantly short width comparing to the light permeability length of the transparent material.

Further, in processing of the transparent material, flash, chip, crack or the like has conventionally occurred in the irradiation region of laser beam, and highly accurate processing has been difficult. However, according to the processing method of the first embodiment of the present invention, highly accurate processing without crack or the like can be realized.

Furthermore, in processing the transparent material by conventional focusing processing using femtosecond laser, very high laser pulse energy has been required for focusing. However, since the absorptive material efficiently absorbs light in the processing method by the first embodiment of the present invention, processing by low energy is made possible. Therefore, improvement in productivity of the three-dimensional structure is expected.

In the laser processing method of the first embodiment of the invention, the brittle material such as glass and ceramic is used as material of processing object. Herein, light having a wavelength region of low absorption to the brittle material may be used as the laser beam for processing. By selecting material of this absorptive thin film material layer, it is possible to select laser of a wide wavelength region as the laser for processing. Because the laser processing method is not dependent on optical characteristics of the brittle material, it can be applied for various kinds of material.

In the regular laser thermal processing, processing to the brittle material has been extremely difficult as well. Specifically, matter that exists in the processing region is quickly removed by irradiation of laser beam on the processing region of the brittle material. This has caused a problem that crack or the like occurred around the processing region.

On the other hand, according to the processing method of the embodiment of the present invention, the absorptive thin film material layer absorbs irradiation energy of the laser beam. The processing region of flat substrate 2, which contacts the absorptive thin film material layer, is removed using the absorbed energy, so that processing of the micro region without flash or the like can be realized. Thus, high quality processing is realized where occurrence of crack or the like is restricted.

Particularly, when irradiation intensity distribution is given to the laser beam and processing is performed, processing only in the intensity distribution center of laser beam for processing 4 occurs, and thus matter removal is made possible in the processing region with a fine width of the irradiation width of laser beam for processing or less.

Still further, in processing of the brittle material using the conventional laser, there has existed a case where extremely high laser pulse energy was required. However, according to the processing method of the first embodiment of the present invention, processing by low energy is made possible because the material of absorptive thin film material layer efficiently absorbs light.

In the laser processing method of the first embodiment of the invention, the metal thin film 3 is used as the absorptive thin film material layer. The metal thin film 3 can be easily fabricated on the flat substrate 2 by a manufacturing method such as vacuum evaporation and sputtering. At this point, it is desirable that the metal thin film 3 has a film thickness of approximately a few nanometers to a few hundred nanometers.

Metal may be many kinds of material having high light absorption ranging from an ultraviolet to a near-infrared region. Use of the material makes it possible to efficiently utilize energy. Herein, since the light permeability length is also short, the laser beam is absorbed on a metal surface of approximately a few nanometers to a few tens nanometers. Because energy concentrates on this very narrow region, removal of a processing area of absorptive thin film material layer and removal of matter on the processing region of processing object can be efficiently performed.

Moreover, since metal material has large thermal diffusion, its energy transfer is also in high-speed, which is effective for removing matter of the processing material on the processing region of processing object.

In the processing method of the first embodiment, Ti: Sapphire laser whose pulse width is a sub-pico second and its harmonic, solid laser such as Nd:YAG laser having a high frequency of pico second order and its harmonic are used as the laser beam for processing, particularly. Further, the metal thin film 3 such as Ni, Au and Al is used as the material of absorptive thin film material layer. It is desirable that the film thickness of metal thin film 3 is the light permeability length of laser beam for processing 4 or more and a few times the length.

In the processing method of the it embodiment, ultra-short pulse laser beam having a pico second order or less is used for the laser beam for processing 4. Development of this laser has been advanced in the recent years. There exists Ti: Sapphire laser as typical laser. The Ti: Sapphire laser normally has the pulse width of approximately a few tens femtoseconds to 200 femtoseconds, and oscillates at the center wavelength near 800 nm.

Since such an ultra-short pulse laser particularly has a short irradiation time onto the processing material, it is known that highly accurate processing can be performed while restricting thermal alteration. The processing characteristics are shown in the reference: Appl. Phys. A63, pp.109–115 (1996), for example.

Since this has a short pulse width of laser beam, it is known that ablation processing can be performed for material such as metal having large thermal conductivity.

As it is described in the above-described reference, it has been made known that, in a time region of a pico second or less, a diffusion equation is described by a two-temperature diffusion equation that electron temperature and grating temperature are not uniform. At this point, the energy of laser beam diffuses as heat to a grating system in approximately a few pico seconds, and removal of matter occurs in the laser irradiation region.

According to the embodiment of the present invention, the metal thin film 3 is used as the absorptive thin film material layer to restrict the thermal diffusion region. Thus, a thermal diffusion range in the metal thin film 3 is limited, removal of the metal thin film 3 is made possible by low energy, and processing of the processing object is efficiently realized in conjunction with the above.

Particularly, since regular metal has a large thermal diffusion length, a removal width widens from the laser irradiation area. However, in this invention, by making the pulse width be a few pico seconds, a thermal diffusion width of typical metal can be 1 micrometer or less. Further, the metal thin film 3 has an advantage of low price and easy fabrication as well.

EXAMPLE

One example of the laser processing method of the first embodiment will be described referring to FIGS. 1A, 1B and 1C.

First, the metal thin film 3 is formed on the flat substrate 2, which is made of transparent material such as glass and quartz or brittle material such as ceramic, by means of such as sputtering, vacuum evaporation and spin coat.

Subsequently, one pulse irradiation of the laser beam for processing 4 having the intensity distribution shown in FIG. 2 is performed to the processing object from above the metal thin film 3. By adjusting the intensity of laser beam of the laser beam for processing 4, removal of the flat glass substrate 2 as the processing object occurs simultaneously with removal of the metal thin film 3 in the laser irradiation section (processing area) of processing object. By performing laser beam irradiation having the laser beam intensity distribution shown in FIG. 2, removal of matter in a material-removing region 2a finer than a material-removing region 3a of metal thin film 3 occurs, and thus the three-dimensional structure 5 having a micro processed shape is formed.

Figure 3:
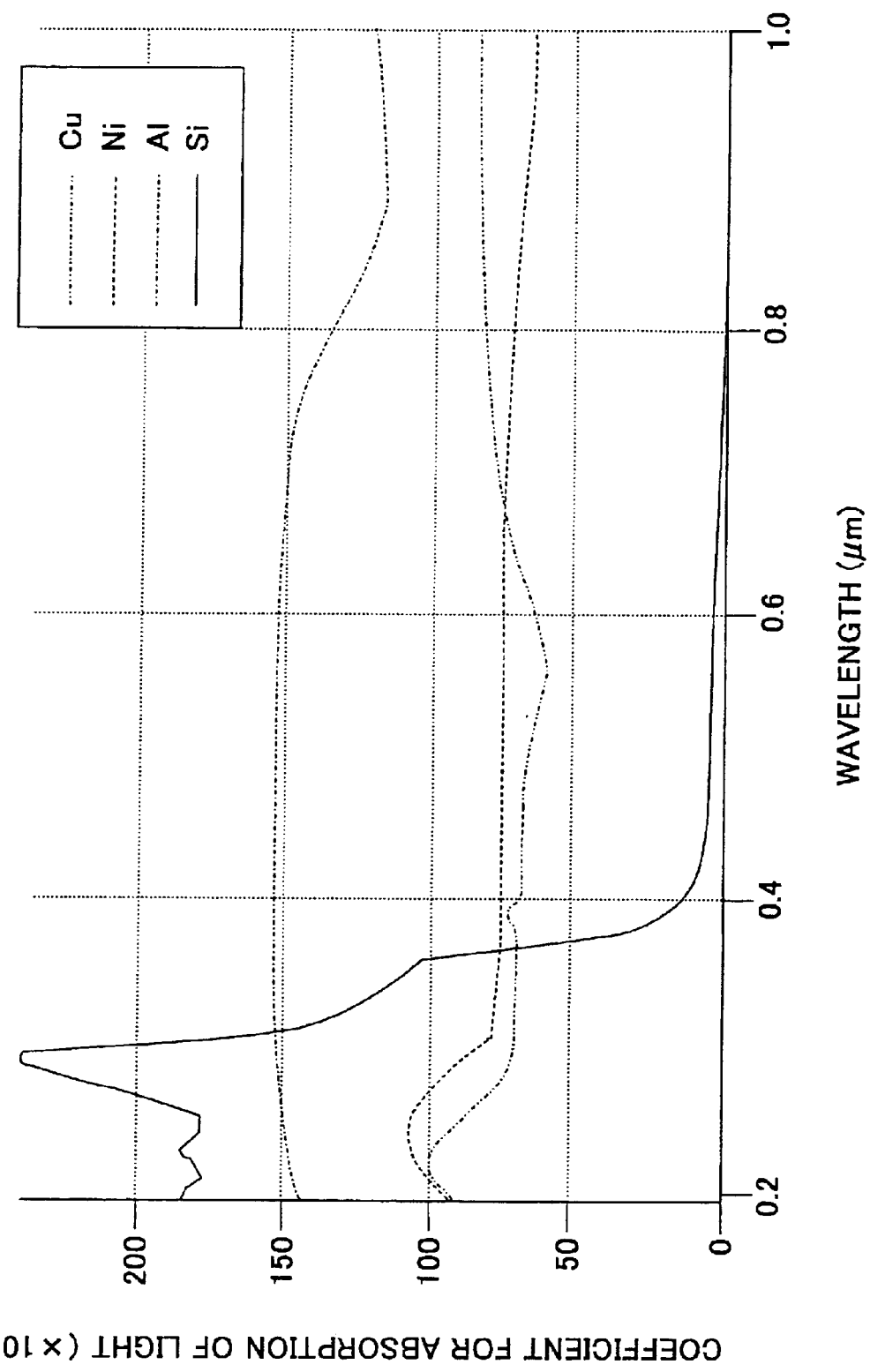
FIG. 3 is a view showing the relationship between coefficient for absorption of light of a typical metal, which is used as an absorptive thin film material layer of the first embodiment of the present invention, and wavelength of light.

FIG. 3 is the view showing the relationship between the coefficient for absorption of light of typical metal, which is used as the absorptive thin film material layer of the first embodiment of the present invention, and the wavelength. FIG. 3 also shows the relationship between the coefficient for absorption of light of silicon and the wavelength as a reference example. Further, FIG. 4 is the view showing the relationship between light permeability length of the typical metal, which is used as the absorptive thin film material layer of the first embodiment of the present invention, and the wavelength of light.

The light absorption of metal does not depend on the wavelength particularly in the visible range and is very large value, as shown in FIG. 3. On the other hand, it is known that light absorption length (light permeability length) D of metal is expressed by the following equation (1) using complex permittivity κ, absorption coefficient α, and wavelength λ.

$$D = \alpha_{-} = \lambda/4\pi\kappa \quad (1)$$

Figure 4:
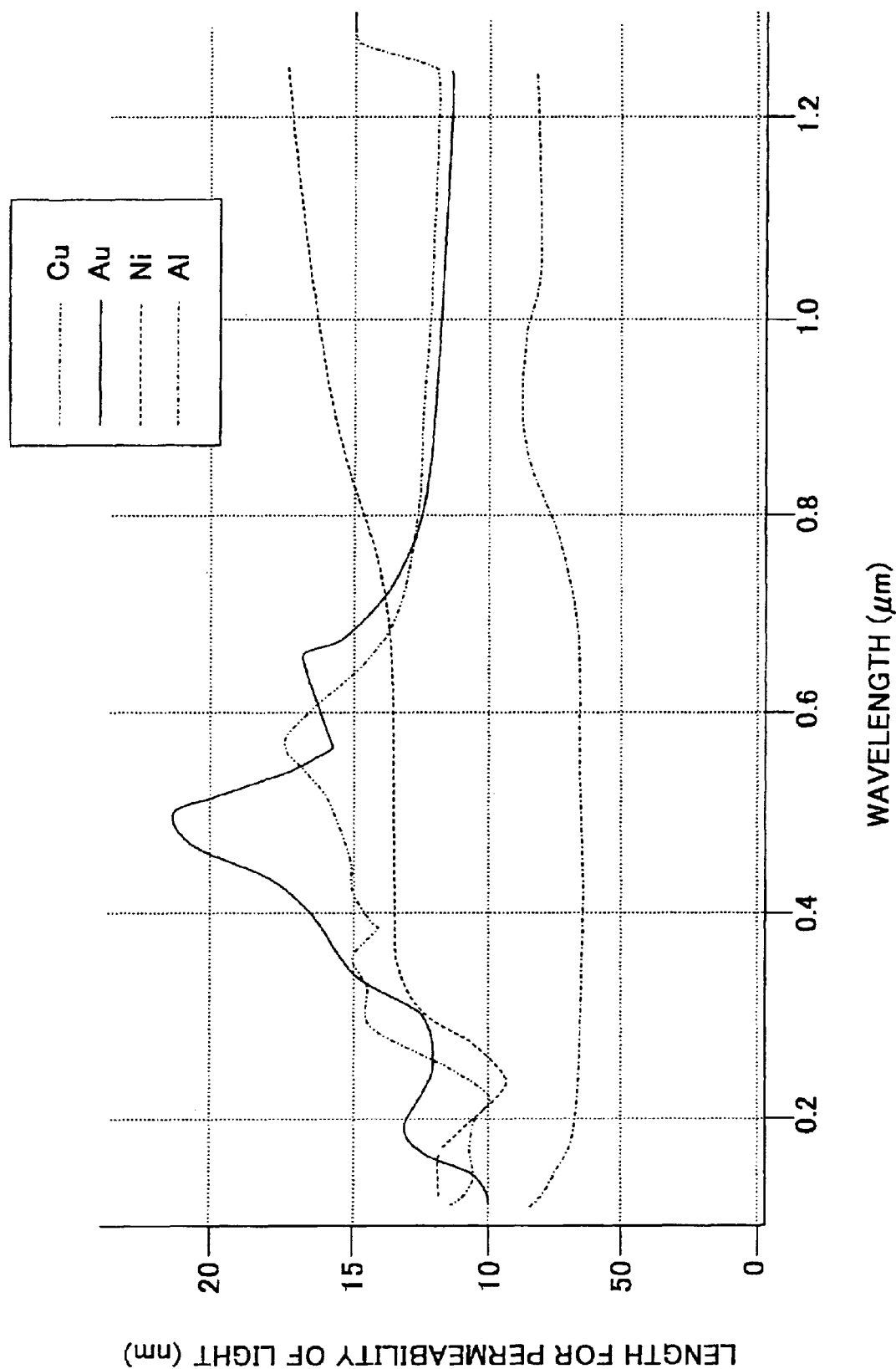
FIG. 4 is a view showing the relationship between light permeability length of the typical metal, which is used as the absorptive thin film material layer of the first embodiment of the present invention, and the wavelength of light.

As shown in FIG. 4, light permeability length is in the order of a few tens nm, which shows that energy concentrates on this narrow region.

Laser having the pulse width of 10 pico seconds or less, which is Ti: Sapphire laser for example, was used as the laser beam for processing 4 in this example 1.

Thermal diffusion length L is expressed by the following equation (2) in the case of thermal diffusivity as D and elapsed time as τ.

$$L = \sqrt{(D\tau)} \quad (2)$$

Thermal diffusivity central values of metal, glass and polymer are expressed in the following table 1.

TABLE 1

| Material | Thermal diffusivity (D) |
|---|---|
| Metal | 20~200 × 10⁻⁶ |
| Glass | 0.3~2 × 10⁻⁶ |
| Polymer | 0.2~0.5 × 10⁻⁶ |

The central values of diffusion length of metal, glass and polymer in elapsed time from the point of irradiation of laser beam 4 are expressed in the following table 2.

TABLE 2

| Thermal diffusion range | 1ps | 1ns | 1 μs (μm) |
|---|---|---|---|
| Metal | ~0.01 | ~0.3 | ~10 |
| Glass | 0.001 | 0.03 | 1 |
| Polymer | <0.001 | 0.02 | 0.5 |

[Second Embodiment]

Figure 5A:
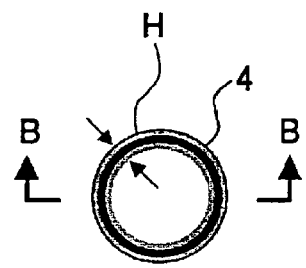
FIG. 5A is an exemplary view of a second embodiment of the present invention, and is a plan view schematically showing the intensity distribution of the laser beam for processing, which has been shaped into a ring shape.
Figure 5B:
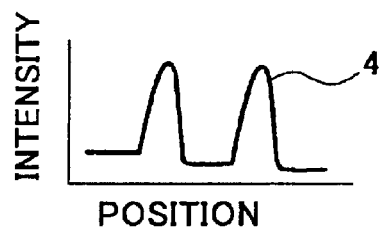
FIG. 5B is a view showing the intensity distribution of the laser beam for processing when
Figure 5C:
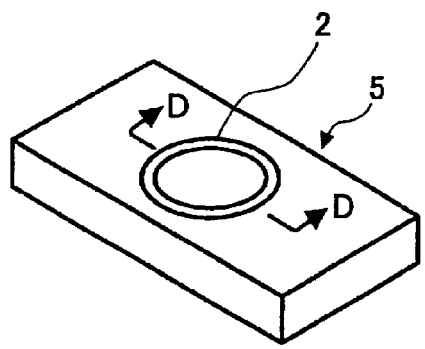
FIG. 5C is a perspective view showing the state where the laser beam for processing shown in FIG. 5A, which has been shaped into the ring shape, is irradiated onto the surface of absorptive material layer of a rectangular three-dimensional shaped processing object.
Figure 5D:
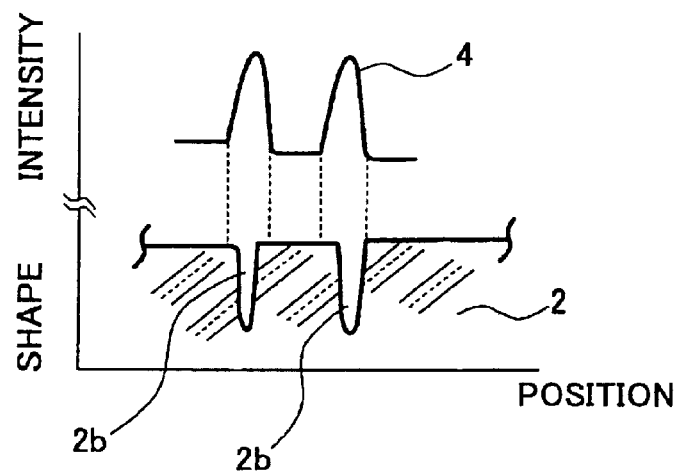
FIG. 5D is a sectional view along D—D line in FIG. 5C, and is a view showing the position of the intensity distribution of laser beam for processing that corresponds to the pore position and pore width of the fine shape formed by irradiation of the laser beam for processing onto the processing object.

FIG. 5A is the plan view schematically showing the relationship between the irradiation shape of shaped laser beam for processing 4 and the intensity distribution of light. FIG. 5B is the exemplary view of the intensity distribution of light along B—B line. FIG. 5C is the perspective view showing the shape of processing object. FIG. 5D is the view showing the relationship between the micro region, which has been formed on the processing position of processing object by irradiating the laser beam for processing, and light intensity distribution.

In the second embodiment, laser irradiation light distribution of the laser beam for processing 4 is shaped by lenses, mirrors, a diffraction optical device, an optical mask, and the like, to have the state that the irradiation light distribution in laser beam irradiation region on the processing object has spatial and selective distribution.

For example, the laser beam is formed into ring beam where the center of orbicular zone has maximum ring-shaped distribution as shown in FIGS. 5A and 5B, a large number of divided beams where the laser beam has been divided into a plurality of spots, or beam having an arbitrary pattern shape or the like.

The beam is shaped such that the intensity of light intensity distribution of the beam shape becomes the maximum particularly at an aimed processing region. The shaped laser beam for processing 4 is irradiated onto the surface of processing object to perform processing of an arbitrary fine shape near the maximum value of laser beam intensity.

By shaping the laser beam for processing 4 in this manner, one pulse irradiation of the laser beam for processing 4 makes it possible to perform microfabrication of an arbitrary shape.

Further, it is possible to perform simultaneously processing for the same fine shapes by using the divided beams at once. Moreover, by allowing the laser beam intensity to have distribution, a processing width and a processing depth can be controlled, and the micropores having different depths can be simultaneously formed by one pulse irradiation of the laser beam for processing 4.

In the laser beam for processing 4 shown in FIGS. 5A and 5B, the beam shape is shaped so as to have the ring-shaped intensity distribution by the diffraction optical device and the like. At this point, the intensity near a central circle of orbicular zone width is larger than the intensity of its periphery.

The laser beam for processing 4 of this beam shape is projected by the lenses and the like and irradiated onto the surface of processing object. Removal of matter occurs in the irradiation region (processing region) of laser beam by the irradiation of laser beam for processing 4 in the same manner as described in the first embodiment, and as shown in FIGS. 5C and 5D, a ring pore 2b (refer to FIG. 5C) having a finer shape than a ring width H of laser beam for processing 4 is formed near the center of the ring width H (refer to FIG. 5A) of laser beam for processing 4.

Accordingly, one pulse irradiation of the laser beam for processing 4 realizes processing of the ring-shaped micro region.

[Third Embodiment]

Figure 6A:
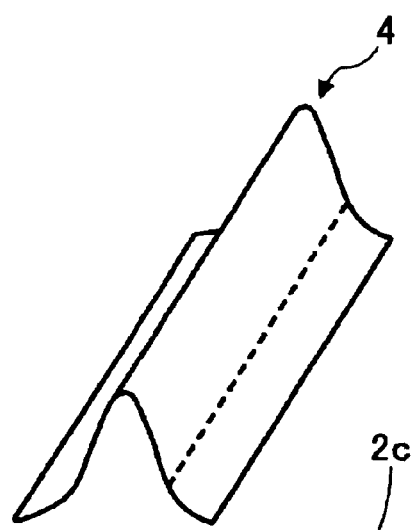
FIG. 6A is a perspective view schematically showing the intensity distribution of laser beam for processing used in a third embodiment of the present invention.
Figure 6B:
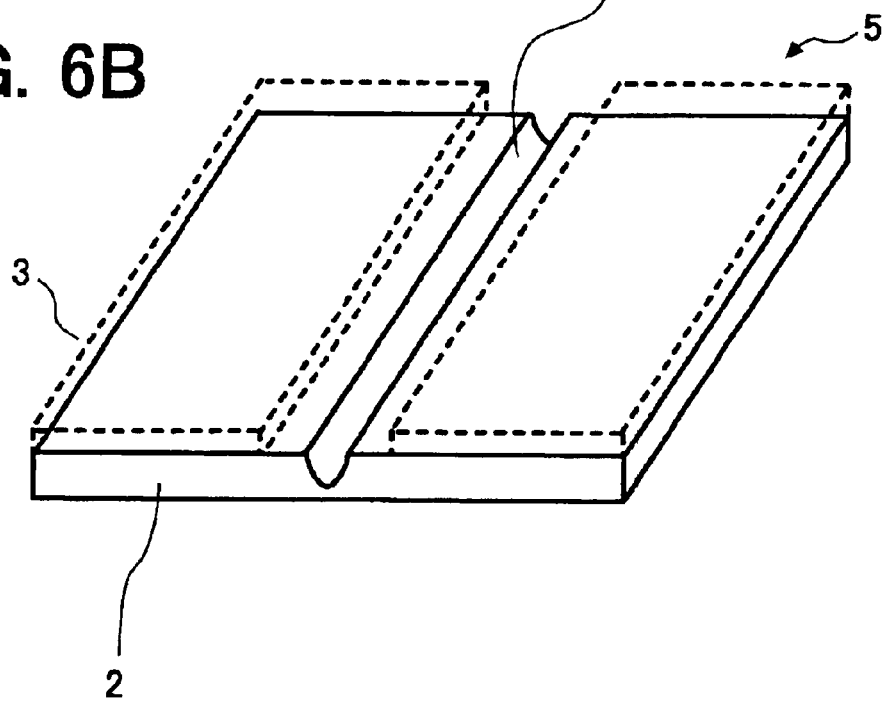
FIG. 6B is a perspective view showing the three-dimensional structure where the fine shape has been processed and formed on the processing object by using the laser beam for processing having the intensity distribution in FIG. 6A.

FIG. 6A is the perspective view schematically showing the intensity distribution of laser beam for processing 4 used in the third embodiment. FIG. 6B is the perspective view of the three-dimensional structure 5 that has been processed by the laser beam for processing 4 having the intensity distribution in FIG. 6A.

The beam shape of laser beam for processing 4 is shaped by lenses, mirrors, a diffraction optical device, an optical mask, and the like, to have the linear-shaped beam shape in the laser irradiation region (processing region) on the processing object as shown in FIG. 6A.

The linear-shaped beam shape can be easily realized by using cylindrical lenses, for example. The shaped laser beam for processing 4 is irradiated on the surface of processing region of the processing object. Thus, as shown in FIG. 6B, a linear-shaped concave portion 2c having a narrower width than the irradiation width of laser beam for processing 4 is formed in the processing region.

As described, by shaping the beam shape of laser beam for processing 4 into the linear shape, one pulse irradiation of laser beam for processing 4 can form a linear-shaped fine shape having the narrower width than the irradiation width on the surface of processing object.

This method can be used for manufacturing the diffraction optical devices or manufacturing micromachines, microcells or the like.

By focusing a beam pattern that has been shaped into the linear shape, the irradiation intensity of laser beam in the processing region can be easily adjusted by using a relatively simple optical system.

Further, when the irradiation position of laser beam for processing 4 to the processing object is controlled to process the processing region (area to be processed) of processing object, a linear-shaped pattern that consists of a continuous linear-shaped concave portion can be formed in an arbitrary pitch.

The laser beam for processing 4, which has been shaped into a shape having the linear-shaped light intensity distribution shown in FIG. 6, is focused by lenses and the like to make a beam shape of an elongate elliptic shape. Thus, a minor axis becomes a beam shape of a shape similar to Gaussian distribution, and is irradiated on the glass substrate 2. Accordingly, a linear-shaped matter-removing area of absorptive thin film material layer and a linear-shaped matter-removing area finer than the linear-shaped matter-removing area of absorptive thin film material layer are fabricated on the processing object. By forming the linear-shaped mater-removing areas in an equal pitch, for example, and removing the metal thin film 3 as the absorptive thin film material layer from the processing object after processing, the three-dimensional structure 5 having micro linear-shaped pattern on the surface of processing object is formed.

[Fourth Embodiment]

Figure 7:
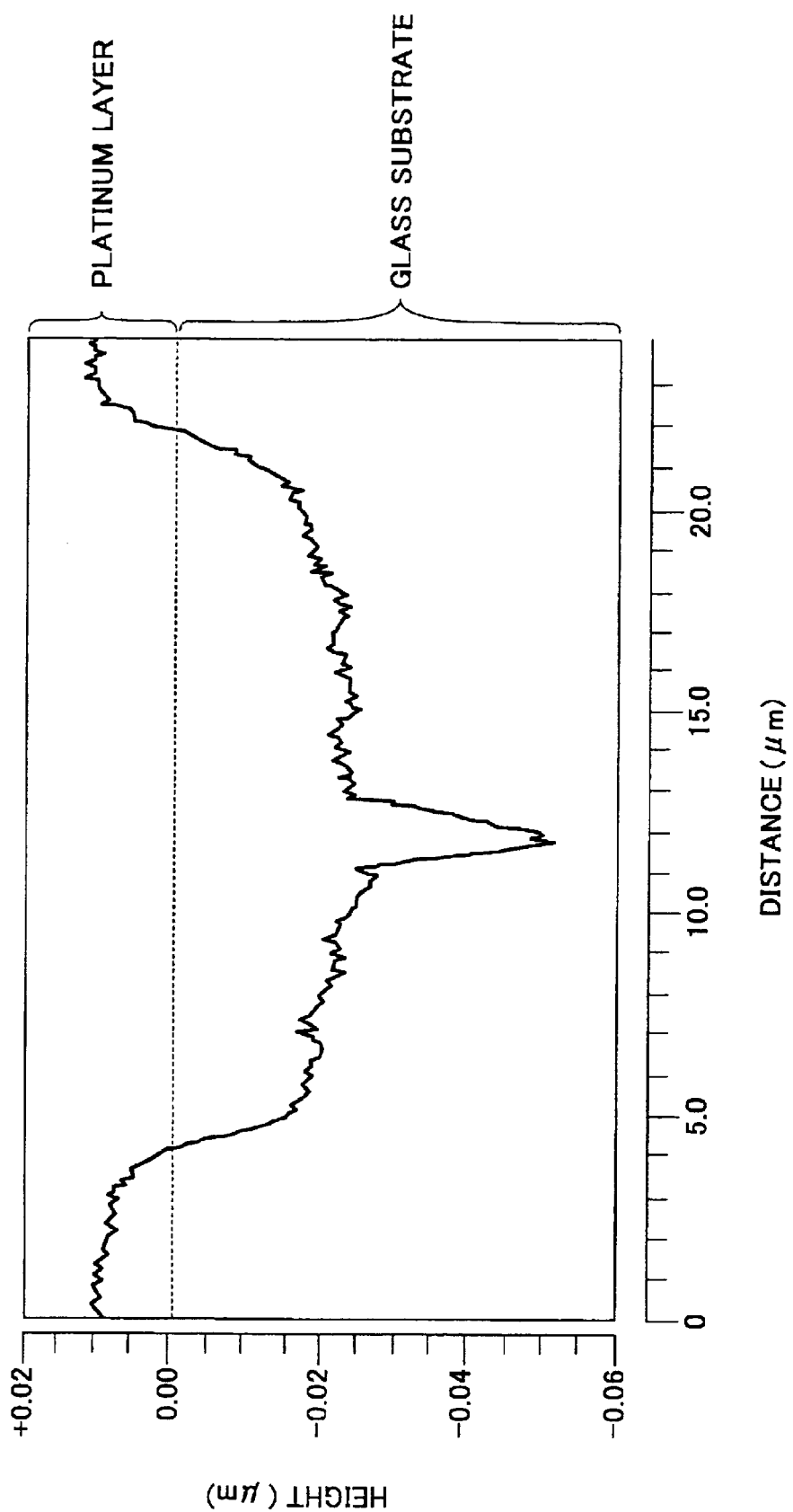
FIG. 7 is an exemplary view of a fourth embodiment of the present invention, and is a view showing into graph that the positional relationship between a width direction distance and a height of three-dimensional structure has been measured, where a two-step micropore shape has been formed on a glass substrate as the processing object by irradiating one pulse of laser beam for processing.

FIG. 7 is the exemplary view of the fourth embodiment of the present invention, and is the view showing into graph that the positional relationship between the width direction distance and the height of the three-dimensional structure has been measured, where the two-step micropore shape has been formed on the glass substrate as the processing object by irradiating one pulse of laser beam for processing.

In the processing method of the fourth embodiment, an object, where the platinum layer as the absorptive thin film material layer has been formed on the glass substrate 2, is used as the processing object.

The laser beam for processing 4 is focused by a condenser lens and the like and irradiated on the processing object from a platinum layer side. At this point, the irradiation beam has intensity distribution of rotational symmetry similar to Gaussian distribution in the irradiation region of laser beam for processing 4. Thus, as shown in FIG. 7, a matter-removing area of glass substrate 2, which has a region of substantially the same diameter as a matter-removing area of platinum layer as the absorptive thin film material layer, and a matter-removing area of glass substrate 2 smaller than the area are formed on the glass substrate 2 in two steps.

By using such a condensing optical system, it is possible to form micropores on the surface of processing object. The condensing optical system can be a very simple constitution and adjustment of the irradiation range and intensity of laser beam is easy, which exerts merit that control of the processing width and processing depth of processing object becomes easy.

Further, it is possible to control a processing diameter of absorptive thin film material layer and a processing diameter of processing object independently, and a two-step three-dimensional shape can be fabricated.

Furthermore, by performing processing while the irradiation position of laser beam for processing 4 is controlled, a large number of pores can be continuously formed.

EXAMPLE

FIG. 7 shows an actual processing example of glass substrate 2. Herein, the platinum layer having the film thickness of 20 nm is used as the absorptive thin film material layer. Further, Ti: Sapphire laser having the central wavelength of 800 nm and the pulse width of approximately 150 femtoseconds is used as the laser beam for processing 4.

At this point, the width of irradiation region of laser beam for processing 4 should be approximately 20 $\mu$m that is substantially equal to the width of matter-removing area of metal thin film 3. By adjusting the irradiation intensity of laser beam for processing 4, the micropore having the width of approximately 2 $\mu$m and the depth of 20 nm is formed near the processing center of processing object. Further, a micropore wider and of a shallower depth than the pore formed near the processing center of processing object is formed, which is a micropore where the width of matter-removing area is approximately the same as the width (20 $\mu$m) of irradiation region and the depth is approximately 20 nm, for example.

This is a removal amount difficult for conventional laser processing to remove, and shows that the processing method of the present invention can realize fine removal.

Further, the two-step-shaped micro region can be simultaneously formed, and the manufacturing method can be used for manufacturing the micromachines, micro sensors or the like.

[Fifth Embodiment]

The laser processing apparatus of the fifth embodiment is constituted by comprising intensity adjustment means that controls the intensity of laser beam for processing, transmission means that transmits the laser beam for processing, positional control means that controls the irradiation position of laser beam for processing, in which an object having a fine shape is formed on an arbitrary position by continuously irradiating the laser beam for processing 4 on the glass substrate 2 as the processing object.

As the intensity adjustment means, optical devices such as a transmissive filter capable of changing transmissivity of laser beam for processing 4 continuously or in steps, a phase modulation element, a half-wave plate, and a polarizing beam splitter are used. As the transmission means, optical devices such as a lens, a mirror and a diffraction optical device are used. Further, as the positional control means, optical devices such as a galvanometer mirror, an f$\theta$ lens and a polygonal mirror, a linear stage that moves while mounting the glass substrate 2, a rotational stage that rotates while mounting the glass substrate 2 are used.

According to the laser processing apparatus of the fifth embodiment, the micro region can be continuously formed across a wide range of processing object by controlling the laser beam for processing 4 to irradiate it onto the surface of processing object. Furthermore, by changing the irradiation intensity of laser beam for processing 4 at the same time, the processing diameter and processing depth of the micro region can be arbitrarily adjusted.

Figure 8:
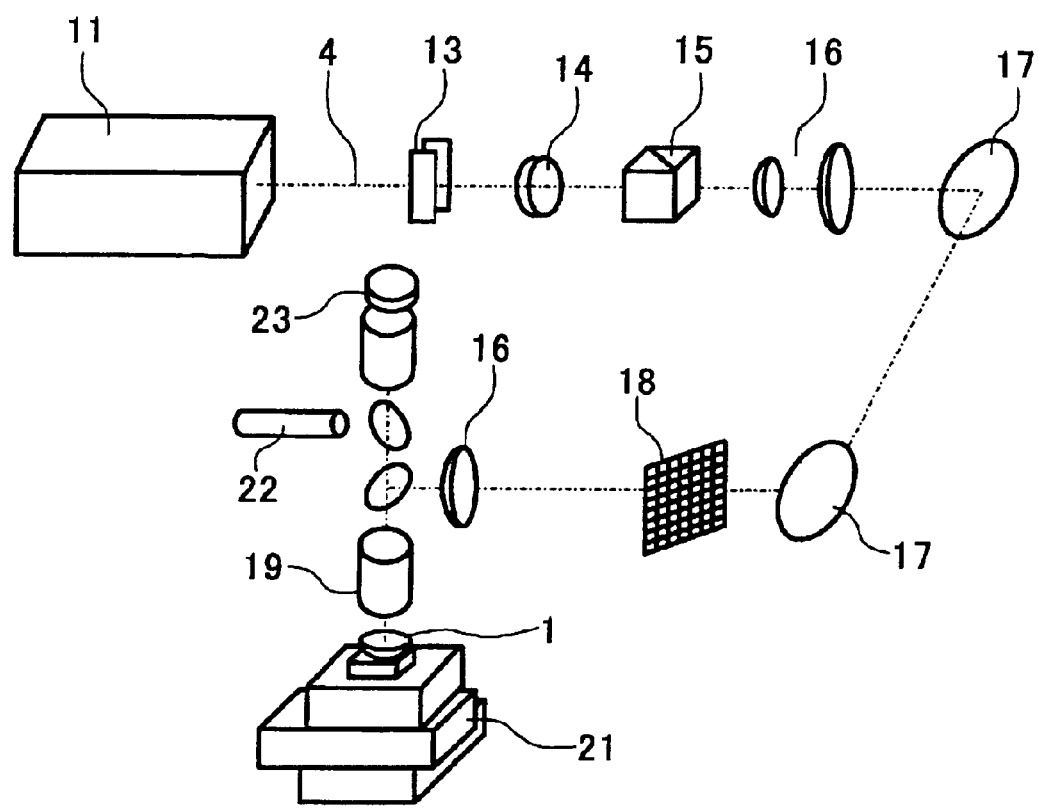
FIG. 8 is an optics view of a laser processing apparatus used in the laser processing method of a fifth embodiment of the present invention.

FIG. 8 is the view of the laser processing apparatus of the three-dimensional structure according to the fifth embodiment of the present invention.

As shown in FIG. 8, the laser processing apparatus of the fifth embodiment is constituted by comprising a laser apparatus 11 as laser beam for processing generation means that outputs the laser beam for processing 4, a half-wave plate 14, the intensity adjustment means of laser beam for processing 4 such as a polarizing beam splitter 15 and an ND filter, and laser beam shaping means such as shaping lenses 16 and reflective mirrors 17.

In the laser processing apparatus, the irradiation position of laser beam for processing 4 is spatially defined. The apparatus can be used for any laser processing method of the first embodiment to the fourth embodiment.

It is desirable that means such as a shutter 13 for controlling the number of irradiation pulse of laser beam be provided inside or outside the laser apparatus 11.

Further, it is desirable that the laser beam for processing 4 be irradiated synchronously with the movement of a moving stage 21 that mounts and fixes the processing object thereon. Herein, laser beam irradiation position control means is constituted by the moving stage 21.

A conventional processing apparatus has had difficulty in performing processing to the refractory material to form the three-dimensional structure having the fine shape. However, according to this laser processing apparatus, it is easy to perform processing to the refractory material to form the three-dimensional structure having the fine shape.

Further, processing of the micro region of a size smaller than the irradiation region of laser beam, which has been difficult conventionally, is made possible. Still further, since it is possible to perform processing by moving the moving stage 21, processing of micro region can be performed across a wide range of processing object.

EXAMPLE

In the laser processing apparatus, the laser beam for processing 4 output from the laser apparatus 11 is made incident into the half-wave plate 14 while the shutter 13 controls irradiation time as shown in FIG. 8.

Herein, rotating the half-wave plate 14 changes a relative direction of a polarizing axis between a polarizing plane of laser beam for processing 4 and the half-wave plate 14. Thus, the polarizing beam splitter 15 adjusts beam intensity. The laser beam for processing 4 whose beam intensity has been adjusted is transmitted while the shaping lenses 16 and the reflective mirrors 17 shapes the beam shape.

In the case of controlling the shape of laser beam for processing 4, shape transfer is performed by using a mask 18 such as a photomask. When processing the micropore, laser beam is not allowed to pass the mask 18 but focused by condenser lens 19, and an image is thus formed on the absorptive thin film material of processing object. The position for processing (processing area) of the processing object is controlled by the moving stage 21 and the like. At this point, in order to observe a processing state at the processing position, an observation device provided with an illumination light source for observation 22 is arranged, and the processed shape can be observed by a CCD camera 23 or the like.

With this laser apparatus for processing, it is possible to easily manufacture the three-dimensional structure having the fine shape.

[Sixth Embodiment]

The three-dimensional structure 5 of the sixth embodiment is one that has a fine three-dimensional shape fabricated by the laser processing apparatus described in the fifth embodiment.

The constitution of the three-dimensional structure 5 is constituted of the glass substrate 2 as the processing object as shown in FIG. 1B, and the metal thin film 3 as the absorptive thin film material layer of high absorption to the laser beam for processing 4, which is formed on the surface of the glass substrate 2 into which the laser beam for processing 4 is made incident.

The three-dimensional structure 5 includes the micro material-removing region 3a of the absorptive thin film material layer 3 that has been removed by the laser beam for processing 4, and the material-removing region 2a of glass substrate 2, which positions in the material-removing region 3a and has a smaller width than the material-removing region 3a.

A typical size of the three-dimensional structure 5 is that the processing width is from a few hundred nanometers to a few tens micrometers and the processing depth is from a few nm to a few micrometers, approximately.

It is possible to make a device fabricated by the constitution of three-dimensional structure of this embodiment become a structure having fine shape and depth. Further, by fabricating a continuous shape on the processing object, setting its depth to the order of wavelength of light makes it possible to function as the transmissive optical device or the reflective optical device, for example.

Since this object has a two-step three-dimensional shape, it can be used for fabricating a device for micromachine, micro sensor or the like as well.

Since the device having the constitution of three-dimensional structure of this embodiment does not use complicate process nor does it use vacuum process or the like, it can be a large size and has advantage in fabricating a large-sized optical device or a device of large area.

[Seventh Embodiment]

A three-dimensional structure 4 of the seventh embodiment corresponds to FIG. 6C, and is a structure having a fine three-dimensional shape fabricated by the laser processing apparatus described in the fifth embodiment. A typical size of this three-dimensional structure is that the processing width is from a few hundred nm to a few tens μm and the processing depth is from a few nm to a few μm, approximately, and the absorptive thin film material layer is selectively removed from the structure by subsequent processing. The selective removal can be realized by solution by solvent, etching or the like, Since the device fabricated by the constitution of the embodiment has had the absorptive thin film material layer removed, it is the three-dimensional shape structure 4 made only by the processing object. For this reason, it can be used without damaging the function of processing object.

For example, by removing the absorptive thin film material layer formed on the processing object, which is made of the transparent material, it is possible to allow the device function as the transmissive optical device, or the absorptive thin film material layer on processing object made of ceramic material is removed and another structure can be subsequently formed on an upper surface. Further, at this point, the shape is not a two-step shape by removing the absorptive thin film material layer, which eliminates restriction of the processing shape and can be applied for wider design values.

[Eighth Embodiment]

The three-dimensional structure of the eighth embodiment is a structure having the fine three-dimensional shape fabricated by the laser processing apparatus of the fifth embodiment. A typical size of the three-dimensional structure is that the processing width is from a few hundred nanometers to a few tens micrometers and the processing depth is from a few nm to a few micrometers, approximately. After fabricating the three-dimensional structure, the metal film is added onto the upper surface of its absorptive thin film material layer or onto the processing object surface from which the absorptive thin film material layer has been peeled, and thus fabricating a metal surface having a fine structure. The metal film to be added can be easily formed by processing such as sputtering and evaporation.

The device fabricated by the constitution of three-dimensional structure of this embodiment is a three-dimensional-shaped structure having the metal surface on a surface. Accordingly, it is used as a mold and duplication by subsequent electroforming processing is possible. By utilizing this, it is possible to fabricate a large number of devices of an identical shape or an inverted shape by fabrication of one device.

Further, by utilizing reflection of metal, the three-dimensional structure can be used as the reflective optical device. This can be used as the reflective diffraction grating or reflective diffraction optical device as well.

As described above, the present invention relates to the laser processing method that directly forms a fine shape on the processing material by irradiation of laser beam. Particularly, it is the laser processing method that forms the micropore smaller than the irradiation region of laser beam by one pulse of laser beam for processing 4 and that is applicable for material having refractory characteristic to the laser beam for processing 4.

Further, the invention particularly aims at highly accurate parts formation where a fine shape is required, which can be used for manufacturing a micro device such as formation of recording bits on an optical disk, a forming method of an optical disk molding stamper that is a master thereof, a fabricating method of an optical device such as a multi-level diffraction grating and a diffractive holograph and a fabricating method of its master, a micropore processing method for the micromachine, micro sensor or the like, a direct pore forming method for transmissive optical material, and the like.

Note that the present invention is not limited to the above-described embodiments and examples. Specifically, the invention can be implemented by performing various kinds of modification without departing from the scope of the present invention.

What is claimed is:

1. A method for processing by laser in which laser beam for processing is irradiated onto a processing object and said laser beam for processing directly removes a part of material of said processing object, comprising the steps of:

forming an absorptive thin film material layer having high absorption to said laser beam for processing on a surface of said processing object, into which the laser beam for processing is made incident; and irradiating the laser beam for processing from a surface of the absorptive thin film material layer to remove the material in a region finer than the laser irradiation region on said processing object.

2. The laser processing method as claimed in claim 1, wherein said processing object is made of material of high permeability to said laser beam for processing.

3. The laser processing method as claimed in claim 1, wherein said processing object is made of brittle material.

4. The laser processing method as claimed in any one of claims 1 to 3, wherein said absorptive thin film material layer is metal thin film.

5. The laser processing method as claimed in claim 1, wherein intensity distribution of said laser beam for processing, which corresponds to a removing region, is shaped corresponding to a processing object shape, and the region finer than the laser irradiation region is subsequently processed.

6. The laser processing method as claimed in claim 5, wherein said laser beam for processing is focused to form a micropore.

7. The laser processing method as claimed in claim 5, wherein said laser beam for processing is shaped into a linear shape.

8. The laser processing method as claimed in claim 6, wherein said laser beam for processing is irradiated while the position of processing object is controlled.

9. The laser processing method as claimed in claim 1, wherein a pulse width of said laser for processing is 10 picoseconds or less.

10. The laser processing method as claimed in claim 1, wherein laser beam intensity and an irradiation position are scanned synchronizing with laser oscillation of said laser beam for processing, and matter removal in the micro region of processing object is continuously performed.

11. A method for processing by laser, comprising the steps of:

forming an absorptive thin film material layer that absorbs light on a surface of a processing object; and processing and forming directly a micro region smaller than an irradiation region of laser beam on the surface of processing object via the absorptive thin film material layer by using the relationship between the absorptive thin film material layer and the intensity distribution of the irradiation region of laser beam for processing onto the processing object.

12. The laser processing method as claimed in claim 11, wherein a beam shape of the laser beam for processing is shaped and irradiated onto the absorptive thin film layer, which has been formed on a surface of said processing object, and said micro region is processed and formed.

13. The laser processing method as claimed in claim 11, wherein said processing object is made of transparent material or brittle material.

* * * * *